(12) United States Patent
Sasaki et al.

(10) Patent No.: US 11,011,653 B2
(45) Date of Patent: May 18, 2021

(54) SCHOTTKY BARRIER DIODE

(71) Applicants: TAMURA CORPORATION, Tokyo (JP); NOVEL CRYSTAL TECHNOLOGY, INC., Saitama (JP)

(72) Inventors: Kohei Sasaki, Sayama (JP); Daiki Wakimoto, Sayama (JP); Yuki Koishikawa, Sayama (JP); Quang Tu Thieu, Sayama (JP)

(73) Assignees: Tamura Corporation, Tokyo (JP); Novel Crystal Technology, Inc., Saitama (JP)

( * ) Notice: Subject to any disclaimer, the term of this patent is extended or adjusted under 35 U.S.C. 154(b) by 6 days.

(21) Appl. No.: 16/484,993

(22) PCT Filed: Feb. 19, 2018

(86) PCT No.: PCT/JP2018/005665
§ 371 (c)(1),
(2) Date: Aug. 9, 2019

(87) PCT Pub. No.: WO2018/159350
PCT Pub. Date: Sep. 7, 2018

(65) Prior Publication Data
US 2019/0363197 A1 Nov. 28, 2019

(30) Foreign Application Priority Data
Feb. 28, 2017 (JP) .............. JP2017-036995

(51) Int. Cl.
*H01L 29/872* (2006.01)
*H01L 21/441* (2006.01)
(Continued)

(52) U.S. Cl.
CPC ........ *H01L 29/8725* (2013.01); *H01L 21/441* (2013.01); *H01L 21/465* (2013.01);
(Continued)

(58) Field of Classification Search
CPC ... H01L 29/8725; H01L 29/24; H01L 29/417; H01L 29/47; H01L 29/66969; H01L 21/441; H01L 21/465
See application file for complete search history.

(56) References Cited

U.S. PATENT DOCUMENTS 8,969,995 B2 3/2015 Spitz et al.
2007/0023781 A1 2/2007 Mizukami et al.
(Continued)

FOREIGN PATENT DOCUMENTS

EP 2 754 736 A1 7/2014
EP 3 182 464 A1 6/2017
(Continued)

OTHER PUBLICATIONS

Kohei Sasaki et al., "$Ga_2O_3$ Schottky Barrier Diodes Fabricated by Using Single-Crystal β-$Ga_2O_3$ (010) Substrates", IEEE Electron Device Letters, (Apr. 2013), vol. 34, No. 4, pp. 493-495.
(Continued)

*Primary Examiner* — Sue A Purvis
*Assistant Examiner* — Scott Stowe
(74) *Attorney, Agent, or Firm* — Scully, Scott, Murphy & Presser, PC

(57) ABSTRACT

Provided is a Schottky barrier diode which is configured from a $Ga_2O_3$-based semiconductor, and has a lower rising voltage than a conventional one. In one embodiment, the Schottky barrier diode 1 is provided which has: a semiconductor layer 10 configured from a $Ga_2O_3$-based single crystal; an anode electrode 11 which forms a Schottky junction with the semiconductor layer 10, and has a portion which contacts the semiconductor layer 10 and is composed of Fe or Cu; and a cathode electrode 12.

3 Claims, 10 Drawing Sheets

(51) Int. Cl.
    H01L 21/465    (2006.01)
    H01L 29/24     (2006.01)
    H01L 29/417    (2006.01)
    H01L 29/47     (2006.01)
    H01L 29/66     (2006.01)

(52) U.S. Cl.
    CPC ............ H01L 29/24 (2013.01); H01L 29/417 (2013.01); H01L 29/47 (2013.01); H01L 29/66969 (2013.01)

(56) References Cited

U.S. PATENT DOCUMENTS

| | | |
|---|---|---|
| 2008/0122323 A1 | 5/2008 | Spitz et al. |
| 2015/0325660 A1 | 11/2015 | Hitora et al. |
| 2017/0179249 A1* | 6/2017 | Oda ................ H01L 21/02414 |
| 2017/0200790 A1 | 7/2017 | Hitora et al. |

FOREIGN PATENT DOCUMENTS

| | | |
|---|---|---|
| EP | 3 588 580 A1 | 1/2020 |
| JP | 2006-352006 A | 12/2006 |
| JP | 2008-521226 A | 6/2008 |
| JP | 2009-177028 A | 8/2009 |
| JP | 2015-227279 A | 12/2015 |
| WO | WO 2016/013554 A1 | 1/2016 |

OTHER PUBLICATIONS

Toshiyuki Oishi et al., "Conduction mechanism in highly doped β-$Ga_2O_3$(201) single crystals grown by edge-defined film-fed growth method and their Schottky barrier diodes", Japanese Journal of Applied Physics (2016), 55, 030305.

T. Shimizu et al., "100V Trench MOS Barrier Schotty Rectifier Using Thick Oxide Layer (TO-TMBS)", Proceedings of 2001 International Symposium on Power Semiconductor Devices & ICs, Osaka (2001), pp. 243-246.

V. Khemka, et al., "A Fully Planarized 4H—SiC Trench MOS Barrier Schotty (TMBS) Rectifier", IEEE Electron Device Letters (May 2000), vol. 21, No. 5, pp. 286-288.

International Search Report dated Mar. 13, 2018, issued in PCT/JP2018/005665.

Extended European Search Report dated Nov. 10, 2020 from related EP 18761989.5.

Notice of Reasons for Refusal dated Dec. 8, 2020 received from the Japanese Patent Office in related application JP 2017-036995 together with English translation.

* cited by examiner

SCHOTTKY BARRIER DIODE

TECHNICAL FIELD

The invention relates to a Schottky barrier diode.

BACKGROUND ART

A Schottky barrier diode, in which a Schottky electrode formed of Pt is connected to a $Ga_2O_3$ single crystal, is known (see, e.g., Non-Patent Literature 1). The turn-on voltage (forward voltage) of the Schottky barrier diode described in Non-Patent Literature 1 is 1.23 V.

Also, a Schottky barrier diode, in which a Schottky electrode having a Ni/Au laminated structure is connected onto a $Ga_2O_3$ single crystal, is known (see, e.g., Non-Patent Literature 2).

Also, a trench MOS Schottky barrier diode using Si as a semiconductor layer and a trench MOS Schottky barrier diode using SiC as a semiconductor layer are known (e.g., Non-Patent Literatures 3 and 4).

CITATION LIST

Non-Patent Literatures

Non-Patent Literature 1: Kohei Sasaki et al., "$Ga_2O_3$ Schottky Barrier Diodes Fabricated by Using Single-Crystal β-$Ga_2O_3$ (010) Substrates", IEEE Electron Device Letters, April 2013, Vol. 34, No. 4, pp. 493-495.
Non-Patent Literature 2: Toshiyuki Oishi et al., "Conduction mechanism in highly doped β-$Ga_2O_3$ (−201) single crystals grown by edge-defined film-fed growth method and their Schottky barrier diodes", Japanese Journal of Applied Physics, 2016, 55, 030305.
Non-Patent Literature 3: T. Shimizu et al., Proceedings of 2001 International Symposium on Power Semiconductor Devices & ICs, Osaka, pp. 243-246 (2001)
Non-Patent Literature 4: V Khemka, et al., IEEE ELECTRON DEVICE LETTERS, VOL. 21, NO. 5, MAY 2000, pp. 286-288

SUMMARY OF INVENTION

Technical Problem

In general, it is necessary to change the turn-on voltage of Schottky barrier diode according to the intended use thereof. Schottky barrier diode having a $Ga_2O_3$-based semiconductor layer is also required to have a turn-on voltage in a range different from the known Schottky barrier diodes, particularly, to have a low turn-on voltage so that forward loss can be kept low.

Thus, it is an object of the invention to provide a Schottky barrier diode which is formed using a $Ga_2O_3$-based semiconductor and has a lower turn-on voltage (a lower rising voltage) than the known Schottky barrier diodes.

Solution to Problem

To achieve the above-mentioned object, an aspect of the invention provides a Schottky barrier diode according to [1] to [6] below.

[1] A Schottky barrier diode, comprising: a first semiconductor layer comprising a $Ga_2O_3$-based single crystal; an anode electrode which forms a Schottky junction with the first semiconductor layer and whose portion to contact with the first semiconductor layer comprises Fe or Cu; and a cathode electrode.

[2] The Schottky barrier diode according to [1], wherein the portion of the anode electrode to contact with the first semiconductor layer comprises Fe, and a turn-on voltage is not less than 0.4 V and not more than 0.5 V.

[3] The Schottky barrier diode according to [1], wherein the portion of the anode electrode to contact with the first semiconductor layer comprises Cu, and a turn-on voltage is not less than 0.6 V and not more than 0.7 V.

[4] The Schottky barrier diode according to [1], comprising: a second semiconductor layer that comprises a $Ga_2O_3$-based single crystal and is laminated on the first semiconductor layer, wherein the first semiconductor layer comprises trenches opening on a surface opposite to the second semiconductor layer, inner surfaces of the trenches are covered with insulating films, and trench MOS barriers are embedded in the trenches so as to be covered with the insulating films, wherein the anode electrode is to contact with the trench MOS barriers, and the cathode electrode is connected to the second semiconductor layer.

[5] The Schottky barrier diode according to [4], wherein the portion of the anode electrode to contact with the first semiconductor layer comprises Fe, and a turn-on voltage is not less than 0.4 V and not more than 0.7 V.

[6] The Schottky barrier diode according to [4], wherein the portion of the anode electrode to contact with the first semiconductor layer comprises Cu, and a turn-on voltage is not less than 0.6 V and not more than 0.9 V.

Advantageous Effects of Invention

According to the invention, it is possible to provide a Schottky barrier diode which is formed using a $Ga_2O_3$-based semiconductor and has a lower turn-on voltage than the known Schottky barrier diodes.

DESCRIPTION OF EMBODIMENTS

First Embodiment (Configuration of Schottky Barrier Diode)

Figure 1:
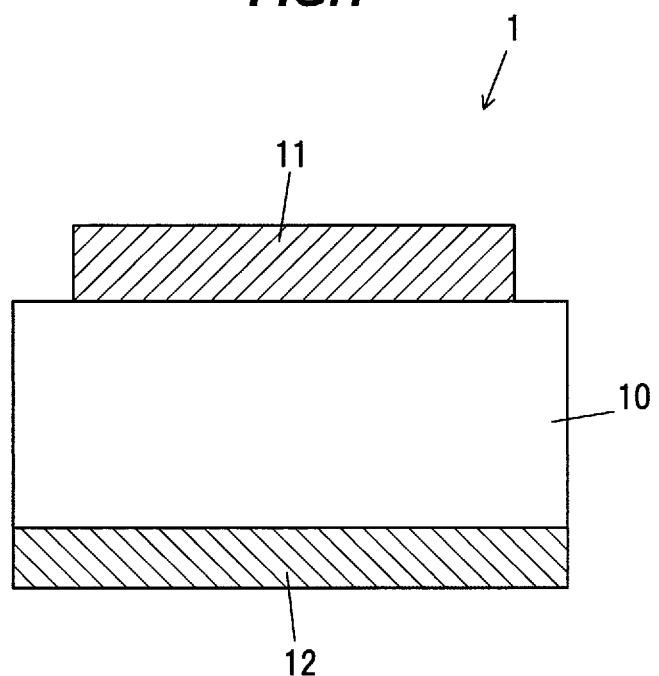
FIG. 1 is a vertical cross-sectional view showing a Schottky barrier diode 1 in the first embodiment.

FIG. 1 is a vertical cross-sectional view showing a Schottky barrier diode 1 in the first embodiment. The Schottky barrier diode 1 is a vertical Schottky barrier diode and has a semiconductor layer 10, an anode electrode 11 formed on one surface of the semiconductor layer 10, and a cathode electrode 12 formed on another surface of the semiconductor layer 10.

The semiconductor layer 10 is a plate-shaped member formed of a $Ga_2O_3$-based single crystal and is typically a $Ga_2O_3$-based substrate. The semiconductor layer 10 may be undoped (with no intentional doping) or may contain a dopant such as Si or Sn. A carrier concentration of the semiconductor layer 10 is preferably, e.g., not less than $1 \times 10^{15}$ cm$^{-3}$ and not more than $1 \times 10^{18}$ cm$^{-3}$.

The $Ga_2O_3$-based single crystal here means a $Ga_2O_3$ single crystal or is a $Ga_2O_3$ single crystal doped with an element such as Al or In, and may be, e.g., a $(Ga_xAl_yIn_{(1-x-y)})_2O_3$ ($0<x\leq1$, $0\leq y<1$, $0<x+y\leq1$) single crystal which is a $Ga_2O_3$ single crystal doped with Al and In. The band gap is widened by adding Al and is narrowed by adding In. The $Ga_2O_3$ single crystal mentioned above has, e.g., a β-crystal structure.

A thickness of the semiconductor layer 10 is preferably not less than 100 nm so that the Schottky barrier diode 1 can have sufficient withstand voltage characteristics. Withstand voltage of the Schottky barrier diode 1 is determined by the thickness and carrier concentration of the semiconductor layer 10. There is no specific upper limit for the thickness of the semiconductor layer 10. On the other hand, since electrical resistance in the thickness direction increases with an increase in the thickness, the semiconductor layer 10 is preferably as thin as possible provided that the required withstand voltage characteristics are obtained.

The semiconductor layer 10 may alternatively have a multilayer structure composed of two or more $Ga_2O_3$-based single crystal layers. In this case, the semiconductor layer 10 is composed of, e.g., a $Ga_2O_3$-based single crystal substrate and a $Ga_2O_3$-based single crystal film epitaxially grown thereon. In case that the anode electrode 11 is connected to the $Ga_2O_3$-based single crystal film and the cathode electrode 12 is connected to the $Ga_2O_3$-based single crystal substrate, for example, the carrier concentration of the $Ga_2O_3$-based single crystal film is set to not less than $1 \times 10^{15}$ cm$^{-3}$ and not more than $1 \times 10^{17}$ cm$^{-3}$ and the carrier concentration of the $Ga_2O_3$-based single crystal substrate is set to not less than $1 \times 10^{17}$ cm$^{-3}$ and not more than $4 \times 10^{19}$ cm$^{-3}$.

The anode electrode 11 is configured so that a portion to contact with the semiconductor layer 10 is formed of Fe or Cu. In detail, the anode electrode 11 when having a single layer structure is entirely formed of Fe or Cu, and the anode electrode 11 when having a multilayer structure is configured so that a layer to contact with the semiconductor layer 10 is formed of Fe or Cu. In both cases, a Schottky barrier is formed at an interface between the Fe or Cu portion of the anode electrode 11 and the semiconductor layer 10, and a Schottky junction is formed between the anode electrode 11 and the semiconductor layer 10.

When the portion of the anode electrode 11 to contact with the semiconductor layer 10 is formed of Fe, the turn-on voltage of the Schottky barrier diode 1 is not less than 0.4V and not more than 0.5V. Meanwhile, when the portion of the anode electrode 11 to contact with the semiconductor layer 10 is formed of Cu, the turn-on voltage of the Schottky barrier diode 1 is not less than 0.6V and not more than 0.7V.

The thickness of the Fe or Cu portion of the anode electrode 11 is preferably not less than 10 nm. When the thickness is less than 10 nm, pinholes may be formed and good rectifying properties may not be obtained. In contrast, when the Fe or Cu portion of the anode electrode 11 has a thickness of not less than 10 nm, good rectifying properties are obtained and differential on-resistance after the current value started to rise is reduced.

There is no upper limit for the thickness of the Fe or Cu portion of the anode electrode 11 in terms of performance of element.

When the anode electrode 11 has a laminated structure, e.g., an Au layer is laminated on a layer formed of Fe or Cu. The Au layer is used to reduce wiring resistance of the electrode itself. The thicker Au layer is better for reducing the wiring resistance, but the thickness of the Au layer is preferably not more than 5000 nm in view of the manufacturing cost.

The cathode electrode 12 is configured so that a portion to contact with the semiconductor layer 10 is formed of a metal such as Ti forming an ohmic junction with $Ga_2O_3$-based single crystal and forms an ohmic junction with the semiconductor layer 10. That is, the cathode electrode 12 when having a single layer structure is entirely formed of Ti, etc., and the cathode electrode 12 when having a multilayer structure is configured so that a layer to contact with the semiconductor layer 10 is formed of Ti, etc. Examples of the multilayer structure of the cathode electrode 12 include Ti/Au and Ti/Al.

In the Schottky barrier diode 1, an energy barrier at an interface between the anode electrode 11 and the semiconductor layer 10 as viewed from the semiconductor layer 10 is lowered by applying forward voltage between the anode electrode 11 and the cathode electrode 12 (positive potential on the anode electrode 11 side), allowing an electric current to flow from the anode electrode 11 to the cathode electrode 12. On the other hand, when reverse voltage is applied between the anode electrode 11 and the cathode electrode 12 (negative potential on the anode electrode 11 side), the electric current does not flow due to the Schottky barrier.

(Method for Manufacturing the Schottky Barrier Diode)

An example of a method for manufacturing the Schottky barrier diode 1 will be described below.

Firstly, a bulk crystal of a $Ga_2O_3$-based single crystal grown by a melt-growth technique such as the FZ (Floating Zone) method or the EFG (Edge Defined Film Fed Growth) method is sliced and the surface thereof is then polished, thereby forming a $Ga_2O_3$-based substrate as the semiconductor layer 10.

Next, the front and back surfaces of the semiconductor layer 10 are pre-treated with a sulfuric acid/hydrogen peroxide mixture (e.g., with a volume ratio of sulfuric acid: hydrogen peroxide:water=4:1:1). In case that a treatment solution other than the sulfuric acid/hydrogen peroxide mixture, such as hydrochloric acid, nitric acid, sulfuric acid, hydrofluoric acid or buffered hydrofluoric acid, is used, treatment with the sulfuric acid/hydrogen peroxide mixture is performed after treatment with such solution. If treatment with the sulfuric acid/hydrogen peroxide mixture is not performed at the end of the pre-treatment, it could cause the turn-on voltage of the Schottky barrier diode 1 to be fixed to about 0.8V to 1.0V, regardless of the material of the anode electrode 11.

Next, the anode electrode 11 and the cathode electrode 12 are respectively formed on the front and back surfaces of the semiconductor layer 10 by vacuum deposition, etc. The anode electrode 11 may be patterned into a predetermined shape such as circle by photo etching, etc.

Second Embodiment (Configuration of Trench MOS Schottky Barrier Diode)

Figure 2A:
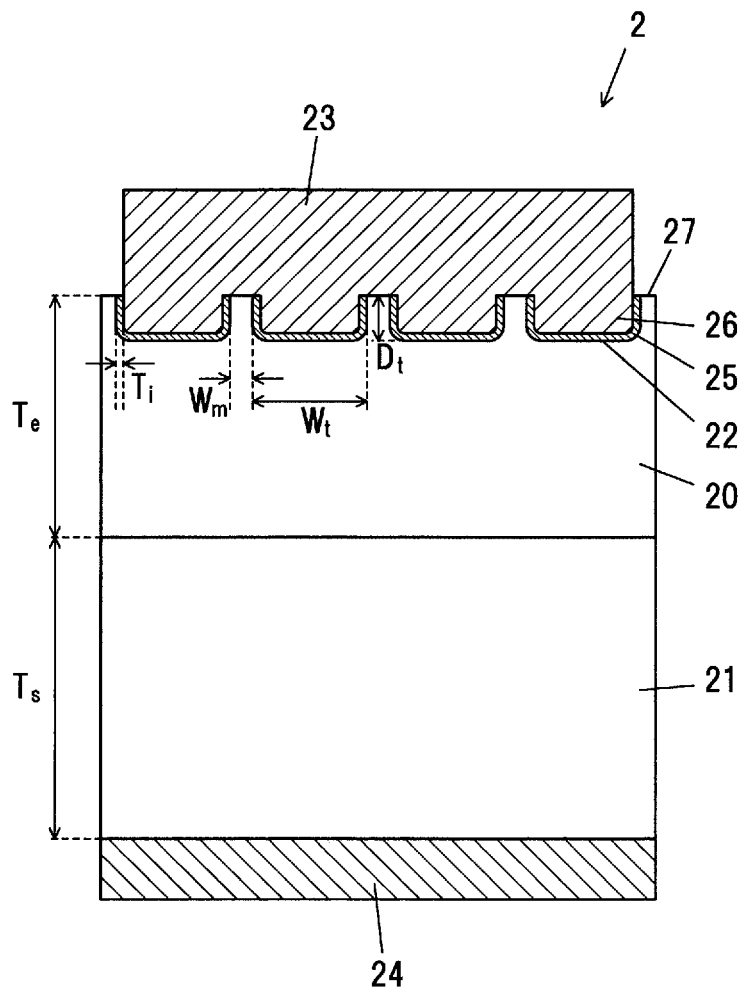
FIG. 2A is a vertical cross-sectional view showing a trench MOS Schottky barrier diode in the second embodiment.

FIG. 2A is a vertical cross-sectional view showing a trench MOS Schottky barrier diode 2 in the second embodiment. The trench MOS Schottky barrier diode 2 is a vertical Schottky barrier diode having a trench MOS region.

The trench MOS Schottky barrier diode 2 has a first semiconductor layer 20, a second semiconductor layer 21 laminated thereon, an anode electrode 23 connected to the first semiconductor layer 20, and a cathode electrode 24 connected to the second semiconductor layer 21.

The first semiconductor layer 20 has trenches 22 opening on a surface 27 opposite to the second semiconductor layer 21. Inner surfaces of the trenches 22 are covered with insulating films 25, and trench MOS barriers 26 are embedded in the trenches 22 so as to be covered with the insulating films 25. The anode electrode 23 is to contact with the trench MOS barriers 26.

In the trench MOS Schottky barrier diode 2, an energy barrier at an interface between the anode electrode 23 and the first semiconductor layer 20 as viewed from the first semiconductor layer 20 is lowered by applying forward voltage between the anode electrode 23 and the cathode electrode 24 (positive potential on the anode electrode 23 side), allowing an electric current to flow from the anode electrode 23 to the cathode electrode 24.

On the other hand, when reverse voltage is applied between the anode electrode 23 and the cathode electrode 24 (negative potential on the anode electrode 23 side), the electric current does not flow due to the Schottky barrier. When reverse voltage is applied between the anode electrode 23 and the cathode electrode 24, a depletion layer spreads from an interface between the anode electrode 23 and the first semiconductor layer 20 and from an interface between the insulating films 25 and the first semiconductor layer 20.

In general, the upper limit of reverse leakage current in Schottky diode is 1 µA. In the embodiment, reverse voltage when a leakage current of 1 µA flows is defined as withstand voltage.

According to data of dependence of reverse leakage current on electric field strength at Schottky interface in Schottky diode having a SiC semiconductor layer described in, e.g., "Technology of Semiconductor SiC and its Application" by Hiroyuki Matsunami, Noboru Otani, Tsunenobu Kimoto und Takashi Nakamura, Second Edition, Nikkan Kogyo Shimbun, Ltd., Sep. 30, 2011, p. 355, electric field strength immediately under Schottky electrode is about 0.8 MV/cm when a current density of reverse leakage current is 0.0001 A/cm². 0.0001 A/cm² here is a current density immediately under the Schottky electrode when an electric current of 1 µA flows through the Schottky electrode having a size of 1 mm×1 mm.

Thus, even when breakdown field strength of the semiconductor material itself is several MV/cm, a leakage current of more than 1 µA flows when the electric field strength immediately under the Schottky electrode exceeds 0.8 MV/cm.

In order to obtain withstand voltage of 1200V in, e.g., a known Schottky diode not having a special structure to reduce electric field strength immediately under Schottky electrode, a donor concentration in a semiconductor layer needs to be reduced to the order of $10^{15}$ cm$^{-3}$ and also the semiconductor layer needs to be very thick so that the electric field strength immediately under the Schottky electrode is kept not more than 0.8 MV/cm. This causes a significant increase in conduction loss, and it is thus difficult to make a Schottky barrier diode having a high withstand voltage and low loss.

The trench MOS Schottky barrier diode 2 in the second embodiment has a trench MOS structure and thus can have a high withstand voltage without an increase in resistance of the semiconductor layer. In other words, the trench MOS Schottky barrier diode 2 is a Schottky diode having a high withstand voltage and low loss.

Junction barrier Schottky (JBS) diode is known as a Schottky diode having a high withstand voltage and low loss. However, $Ga_2O_3$ is not suitable as a material for the JBS diode requiring a p-type region since it is difficult to manufacture p-type $Ga_2O_3$.

The second semiconductor layer 21 is formed of an n-type $Ga_2O_3$-based single crystal containing a Group IV element, such as Si or Sn, as a donor. A donor concentration of the second semiconductor layer 21 is, e.g., not less than 1.0× $10^{18}$ and not more than 1.0×$10^{20}$ cm$^{-3}$. A thickness $T_s$ of the second semiconductor layer 21 is, e.g., 10 to 600 µm. The second semiconductor layer 21 is, e.g., a $Ga_2O_3$-based single crystal substrate.

The first semiconductor layer 20 is formed of an n-type $Ga_2O_3$-based single crystal containing a Group IV element, such as Si or Sn, as a donor. A donor concentration of the first semiconductor layer 20 is lower than the donor concentration of the second semiconductor layer 21. The first semiconductor layer 20 is, e.g., an epitaxial layer epitaxially grown on the second semiconductor layer 21 which is a $Ga_2O_3$-based single crystal substrate.

A high-donor-concentration layer containing a high concentration of donor may be additionally formed between the first semiconductor layer 20 and the second semiconductor layer 21. In other words, the first semiconductor layer 20 and the second semiconductor layer 21 are laminated via the high-donor-concentration layer. The high-donor-concentration layer is used when, e.g., the first semiconductor layer 20 is epitaxially grown on the second semiconductor layer 21 as a substrate. At the early growth stage of the first semiconductor layer 20, the amount of dopant incorporated thereinto is unstable and an acceptor impurity is diffused from the second semiconductor layer 21 as a substrate. Thus, in some cases, resistance increases in a region of the first semiconductor layer 20 close to the interface with the second semiconductor layer 21 when the first semiconductor layer 20 is grown directly on the second semiconductor layer 21. The high-donor-concentration layer is used to avoid such problems. The concentration in the high-donor-concentration layer is set to be, e.g., higher than the concentration in the first semiconductor layer 20, more preferably, higher than the concentration in the second semiconductor layer 21.

As the donor concentration in the first semiconductor layer 20 increases, electrical field strength in each part of the trench MOS Schottky barrier diode 2 increases. The donor concentration in the first semiconductor layer 20 is preferably not more than about $1.0 \times 10^{17}$ cm$^{-3}$ to lower the maximum electric field strength in a region of the first semiconductor layer 20 immediately under the anode electrode 23, the maximum electric field strength in the first semiconductor layer 20 and the maximum electric field strength in the insulating film 25. On the other hand, as the donor concentration decreases, resistance of the first semiconductor layer 20 increases and the forward loss increases. Therefore, to obtain withstand voltage of, e.g., not more than 1200V, the donor concentration is preferably not less than $3.0 \times 10^{16}$ cm$^{-3}$. To obtain higher withstand voltage, the donor concentration may be reduced to, e.g., about $1.0 \times 10^{16}$ cm$^{-3}$.

As a thickness $T_e$ of the first semiconductor layer 20 increases, the maximum electric field strength in the first semiconductor layer 20 and the maximum electric field strength in the insulating film 25 decrease. By adjusting the thickness $T_e$ of the first semiconductor layer 20 to not less than about 3 µm, it is possible to effectively reduce the maximum electric field strength in the first semiconductor layer 20 and the maximum electric field strength in the insulating film 25. In view of reduction in these maximum electric field strengths and downsizing of the trench MOS Schottky barrier diode 2, the thickness $T_e$ of the first semiconductor layer 20 is preferably about not less than 3 µm and not more than 9 µm.

Electrical field strength in each part of the trench MOS Schottky barrier diode 2 changes depending on a depth $D_t$ of the trench 22. The depth $D_t$ of the trench 22 is preferably about not less than 1.5 µm and not more than 6 µm to lower the maximum electric field strength in a region of the first semiconductor layer 20 immediately under the anode electrode 23, the maximum electric field strength in the first semiconductor layer 20 and the maximum electric field strength in the insulating film 25.

When a width $W_t$ of the trench 22 is narrower, the conduction loss can be more reduced but it is more difficult to manufacture, causing a decrease in production yield. Therefore, the width $W_t$ is preferably not less than 0.3 µm and not more than 5 µm.

As a width $W_m$ of a mesa-shaped portion between adjacent trenches 22 on the first semiconductor layer 20 decreases, the maximum electric field strength in a region of the first semiconductor layer 20 immediately under the anode electrode 23 decreases. The width $W_m$ of the mesa-shaped portion is preferably not more than 4 µm to lower the maximum electric field strength in a region of the first semiconductor layer 20 immediately under the anode electrode 23. At the same time, the width $W_m$ of the mesa-shaped portion is preferably not less than 0.25 µm since it is more difficult to make the trenches 22 when the width of the mesa-shaped portion is smaller.

Since the maximum electric field strength in the insulating film 25 decreases as permittivity of the insulating film 25 increases, the insulating film 25 is preferably formed of a high-permittivity material. For example, $Al_2O_3$ (relative permittivity of about 9.3) and $HfO_2$ (relative permittivity of about 22) can be used as a material of the insulating film 25, and it is particularly preferable to use $HfO_2$ which has high permittivity.

Meanwhile, as a thickness $T_i$ of the insulating film 25 increases, the maximum electric field strength in the first semiconductor layer 20 decreases but the maximum electric field strength in the insulating film 25 and the maximum electric field strength in a region immediately under the anode electrode 23 increase. In view of ease of manufacturing, the thickness of the insulating film 25 is preferably smaller, and is more preferably not more than 300 nm. It is, however, obvious that a certain thickness is required so that an electric current virtually does not flow directly between the trench MOS barrier 26 and the second semiconductor layer 20.

The anode electrode 23 is configured so that a portion to contact with the first semiconductor layer 20 is formed of Fe or Cu, and the anode electrode 23 is in Schottky contact with the first semiconductor layer 20.

The material of the trench MOS barrier 26 is not specifically limited as long as it is electrically conductive, and it is possible to use, e.g., polycrystalline Si doped at a high concentration and a metal such as Ni or Au. However, when the trench MOS barriers 26 and the anode electrode 23 are formed integrally as shown in FIG. 2A, the surface layer of each trench MOS barrier 26 is also formed of Fe or Cu since the portion of the anode electrode 23 to contact with the first semiconductor layer 20 is formed of Fe or Cu.

Figure 2B:
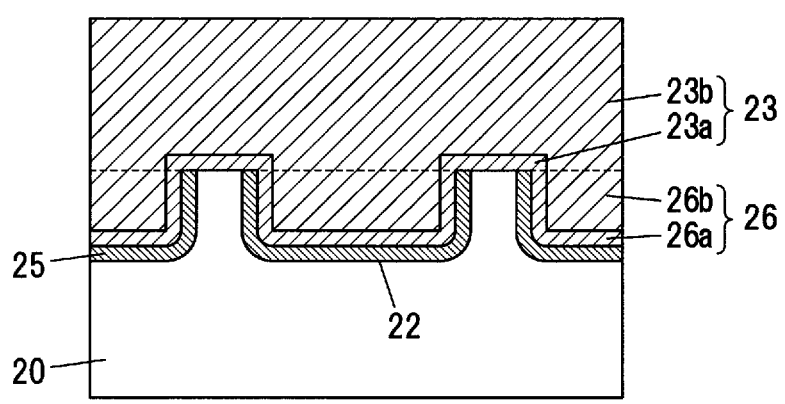
FIG. 2B is an enlarged view showing the vicinity of a trench when trench MOS barriers and an anode electrode are formed integrally.

FIG. 2B is an enlarged view showing the vicinity of the trench 22 when the trench MOS barriers 26 and the anode electrode 23 are formed integrally. The anode electrode 23 has a first layer 23a to contact with the first semiconductor layer 20, and a second layer 23b formed thereon. The trench MOS barrier 26 has a first layer 26a to contact with the insulating film 25, and a second layer 26b formed thereon.

The first layer 23a of the anode electrode 23 and the first layer 26a of the trench MOS barrier 26 are formed as a continuous single film of Fe or Cu. Likewise, the second layer 23b of the anode electrode 23 and the second layer 26b of the trench MOS barrier 26 are formed as a continuous single film of a conductive material such as Au.

Here, in case that the first layer 26a of the trench MOS barrier 26 is formed of Cu and is thick to the extent that the trench MOS barrier 26 consists of only the first layer 26a, a gap is formed between the trench MOS barrier 26 and the insulating film 25 due to contraction of Cu. Therefore, to prevent a decrease in reliability of the trench MOS Schottky barrier diode 2, it is preferable that the trench MOS barrier 26 be composed of the first layer 26a and the second layer 26b, i.e., it is preferable that the first layer 26a and the second layer 26b be embedded in the trench 22.

When the portion of the anode electrode 23 to contact with the first semiconductor layer 20 (i.e., the first layer 23a) is formed of Fe, the turn-on voltage of the trench MOS Schottky barrier diode 2 is not less than 0.4V and not more than 0.7V. Meanwhile, when the portion of the anode electrode 23 to contact with the first semiconductor layer 20 (i.e., the first layer 23a) is formed of Cu, the turn-on voltage of the trench MOS Schottky barrier diode 2 is not less than 0.6V and not more than 0.9V. The turn-on voltage is slightly higher than that of the Schottky barrier diode 1 in the first embodiment even though the anode electrode material is the same, because the trench MOS structure causes a potential barrier to be formed in the mesa-shaped portion. This is determined by the width $W_m$ of the mesa-shaped portion, such that the smaller the width $W_m$, the higher the turn-on voltage.

The electric field strength in the trench MOS Schottky barrier diode 2 is affected by the width of the mesa-shaped portion between two adjacent trenches 22, the depth D, of the trench 22 and the thickness $T_i$ of the insulating film 25, etc., as described above but is hardly affected by the planar pattern of the trenches 22. Therefore, the planar pattern of the trenches 22 on the first semiconductor layer 20 is not specifically limited.

The cathode electrode 24 is in ohmic contact with the second semiconductor layer 21. The cathode electrode 24 is formed of a metal such as Ti. The cathode electrode 24 may have a multilayer structure formed by laminating different metal films, e.g., Ti/Au or Ti/Al. For reliable ohmic contact between the cathode electrode 24 and the second semiconductor layer 21, the cathode electrode 24 is preferably configured that a layer to contact with the second semiconductor layer 21 is formed of Ti.

(Method for Manufacturing the Trench MOS Schottky Barrier Diode)

An example of a method for manufacturing the trench MOS Schottky barrier diode 2 will be described below.

FIGS. 3A to 3C and 4A to 4C are vertical cross-sectional views showing a process of manufacturing the trench MOS Schottky barrier diode 2 in the second embodiment.

Figure 3A:
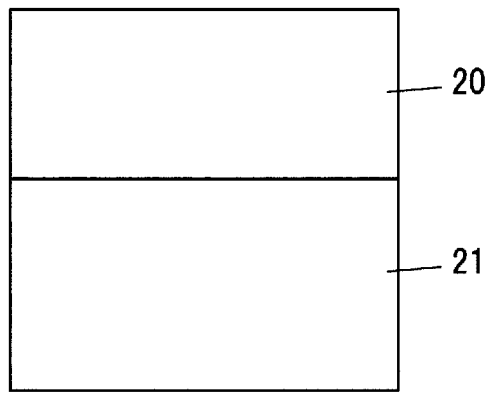
FIG. 3A is a vertical cross-sectional view showing a process of manufacturing the trench MOS Schottky barrier diode in the second embodiment.

Firstly, as shown in FIG. 3A, a $Ga_2O_3$-based single crystal is epitaxially grown on the second semiconductor layer 21 such as a $Ga_2O_3$-based single crystal substrate by the HVPE (Hydride Vapor Phase Epitaxy) method, etc., thereby forming the first semiconductor layer 20.

Figure 3B:
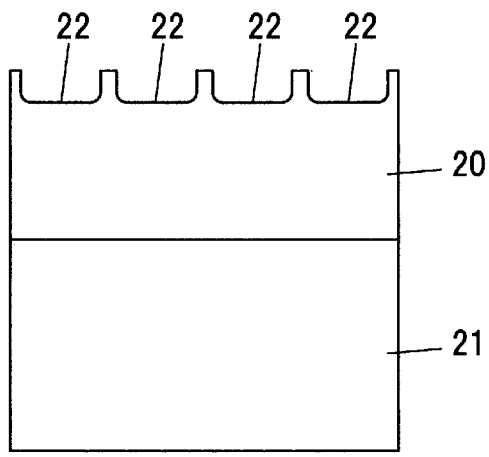
FIG. 3B is a vertical cross-sectional view showing the process of manufacturing the trench MOS Schottky barrier diode in the second embodiment.

Next, as shown in FIG. 3B, the trenches 22 are formed on the upper surface of the first semiconductor layer 20 by photo etching, etc.

In case that dry etching is used to form the trenches 22, the preferable conditions are, e.g., use of $BCl_3$ (30 sccm) as an etching gas, pressure of 1.0 Pa, antenna power of 160 W, bias power of 17 W, and duration of 90 minutes.

Treatment with phosphoric acid is preferably performed after forming the trenches 22 to remove roughness from inner surfaces of the trenches. Typically, immersion in phosphoric acid heated to 130 to 140° C. for 5 to 30 minutes is preferable.

Figure 3C:
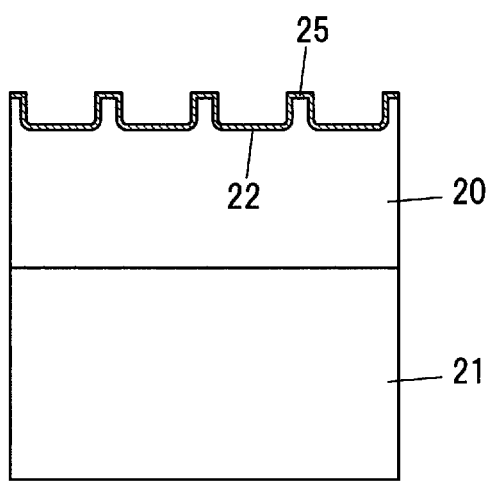
FIG. 3C is a vertical cross-sectional view showing the process of manufacturing the trench MOS Schottky barrier diode in the second embodiment.

Next, as shown in FIG. 3C, the insulating film 25 made of $HfO_2$, etc., is formed on the upper surface of the first semiconductor layer 20 by the ALD (Atomic Layer Deposition) method, etc., so that the inner surfaces of the trenches 22 are covered. The conditions for $HfO_2$ film formation are not specifically limited, and the film is formed by, e.g., alternately supplying TDMAH as an Hf raw material for 0.25 seconds and $O_3$ as an oxidizing agent for 0.15 seconds. The substrate temperature at this time is 250° C.

Figure 4A:
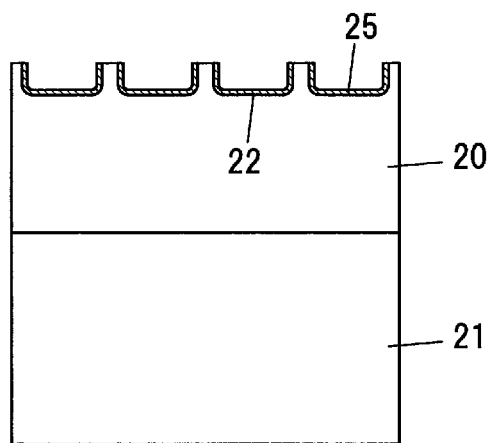
FIG. 4A is a vertical cross-sectional view showing the process of manufacturing the trench MOS Schottky barrier diode in the second embodiment.

Next, as shown in FIG. 4A, part of the insulating film 25 outside the trenches 22 (portions located on the mesa-shaped portions between the trenches 22) is removed by a planarization process such as CMP (Chemical Mechanical Polishing).

Figure 4B:
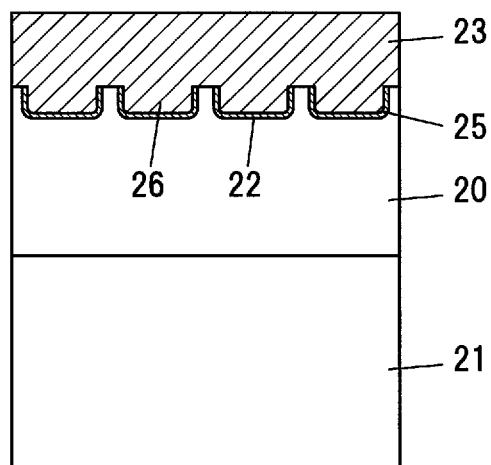
FIG. 4B is a vertical cross-sectional view showing the process of manufacturing the trench MOS Schottky barrier diode in the second embodiment.

Next, as shown in FIG. 4B, the trench MOS barriers 26 and the anode electrode 23, which have a Cu/Au/Ni laminated structure, etc., are formed continuously and integrally by electron beam evaporation, etc.

Before depositing the trench MOS barriers 26 and the anode electrode 23, treatment with a sulfuric acid/hydrogen peroxide mixture is performed to remove CMP abrasive, etc. When a treatment solution other than the sulfuric acid/hydrogen peroxide mixture, such as hydrochloric acid, nitric acid, sulfuric acid, hydrofluoric acid or buffered hydrofluoric acid, is used, treatment with the sulfuric acid/hydrogen peroxide mixture is performed after treatment with such solution to prevent the turn-on voltage from being fixed to about 0.8 to 1.0V.

Figure 4C:
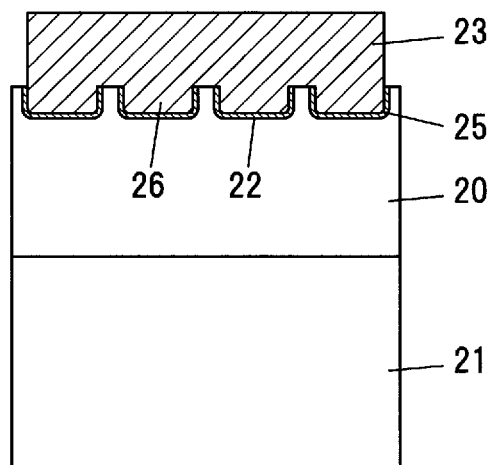
FIG. 4C is a vertical cross-sectional view showing the process of manufacturing the trench MOS Schottky barrier diode in the second embodiment.

Next, as shown in FIG. 4C, the anode electrode 23 is patterned into a predetermined shape such as circle by photo etching, etc.

After that, the cathode electrode 24 having a Ti/Au laminated structure, etc., is formed on the bottom surface of the second semiconductor layer 21 by electron beam evaporation, etc., thereby obtaining the trench MOS Schottky barrier diode 2.

Effects of the Embodiments

In the first and second embodiments, by using Fe or Cu as the material of the anode electrode which serves as a Schottky electrode, Schottky barrier diode having a semiconductor layer formed of a $Ga_2O_3$-based single crystal can have a lower turn-on voltage than the known Schottky barrier diodes.

Example 1

Using Schottky barrier diodes having the same structure as the Schottky barrier diode 1 in the first embodiment, change in turn-on voltage when the material of the anode electrode serving as a Schottky electrode is different was examined.

In Example 1, a 650 μm-thick $Ga_2O_3$ substrate which was undoped (with no intentionally added donor) and had a donor concentration of not more than $1\times10^{17}$ cm$^{-3}$ was used as the semiconductor layer.

A circular electrode having a diameter of 200 μm was formed as the anode electrode by electron beam evaporation. Before depositing the anode electrode, the surface of the semiconductor layer was treated with a sulfuric acid/hydrogen peroxide mixture. Al, Ag, Fe, Cu, Ni, Pt and Pd were used as the anode electrode material.

Then, an electrode having a Ti/Au laminated structure was formed as the cathode electrode on the entire back surface of the semiconductor layer by electron beam evaporation.

Firstly, the turn-on voltage was measured on the Schottky barrier diodes respectively having the anode electrodes formed of different materials.

Figure 5:
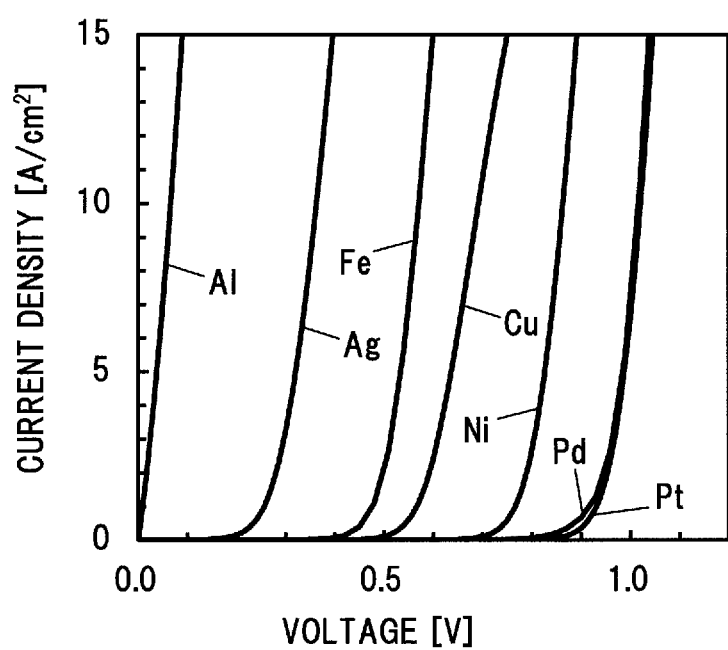
FIG. 5 is a graph showing a relation between a material of the anode electrode and a turn-on voltage of the Schottky barrier diode in Example 1.

FIG. 5 is a graph showing a relation between a material of the anode electrode and a turn-on voltage of the Schottky barrier diode in Example 1.

FIG. 5 shows that the turn-on voltages of the Schottky barrier diodes, when the anode electrode material is Al, Ag, Fe, Cu, Ni, Pt and Pd, are respectively about 0.0V, 0.3V, 0.5V, 0.6V, 0.8V, 0.95V and 0.95V.

Of those materials, Ni and Pt are known as materials of Schottky electrode to be to contact with semiconductor layer formed of $Ga_2O_3$-based single crystal. Fe and Cu provide different turn-on voltages from when using Ni and Pt and are thus usable as new Schottky electrode materials.

When the anode electrode is formed of Fe, the turn-on voltage of the Schottky barrier diode, including variation, is not less than 0.4V and not more than 0.5V. Meanwhile, when the anode electrode is formed of Cu, the turn-on voltage of the Schottky barrier diode, including variation, is not less than 0.6V and not more than 0.7V.

In a trench MOS Schottky barrier diode as is the trench MOS Schottky barrier diode 2 in the second embodiment, reverse leakage is effectively reduced when the turn-on voltage is not less than 0.4V. This means that when using Fe or Cu as the anode electrode material, it is possible to lower the turn-on voltage while effectively reducing the reverse leakage.

Next, the Schottky barrier diodes respectively having the anode electrodes formed of Al, Ag, Fe, Cu, Ni and Pd were annealed to evaluate heat resistance of the anode electrode. The annealing temperature was increased to 200° C., 300° C. and 400° C. in this sequence, the annealing time was 10 minutes, and the annealing atmosphere was nitrogen.

When the anode electrode material was Al, annealing at 200° C. caused a hundredfold or more increase in conduction resistance, and annealing at 300° C. caused an increase in the turn-on voltage to about 0.5V but conduction loss was recovered to the same level as immediately after deposition. Then, by annealing at 400° C., the turn-on voltage was lowered to about 0.4V and conduction loss was further increased about twofold.

When the anode electrode material was Ag, annealing at 200° C. caused roughness on the electrode surface and an increase in the turn-on voltage to about 0.5V. Annealing at 300° C. caused an increase in the turn-on voltage to about 1.0 to 1.1V and a hundredfold or more increase in conduction resistance. Then, by annealing at 400° C., the Schottky barrier vanished and the characteristics changed to ohmic-like characteristics.

When the anode electrode material was Fe, annealing at 100° C. caused a hundredfold or more increase in conduction resistance, annealing at 200° C. caused a little more increase in the resistance, and annealing at 300° C. caused the characteristics to return to the level immediately after forming the electrode. Annealing at 400° C. did not cause any change on the characteristics exhibited after annealing at 300° C. Based on these results, it is considered that the characteristics of the anode electrode formed of Fe can be stabilized by annealing at 300° C. or 400° C. after the electrode formation.

When the anode electrode material was Cu, the turn-on voltage, which was about 0.6V immediately after deposition, was increased to about 0.7V by annealing at 200° C., was increased to about 0.9V by annealing at 300° C., and was further increased to about 1.1V annealing at 400° C.

When the anode electrode material was Ni, no particular change was observed after annealing at 200° C. and 300° C., but annealing at 400° C. caused the conduction loss to rapidly increase about thousandfold.

When the anode electrode material was Pd, the characteristics were similar to those when using Fe: annealing at 100° C. caused a rapid increase in conduction resistance, annealing at 200° C. caused a little more increase in the resistance, and annealing at 300° C. caused the characteristics to return to the level immediately after forming the electrode. Annealing at 400° C. did not cause any change on the characteristics exhibited after annealing at 300° C. Based on these results, it is considered that the characteristics of the anode electrode formed of Pd can be also stabilized by annealing at 300° C. or 400° C. after the electrode formation, in the same manner as the anode electrode formed of Fe.

The above results show that the anode electrode formed of Ni exhibits a relatively small change with temperature increase and is excellent in heat resistance. On the other hand, it is also shown that the anode electrodes formed of Al, Ag and Cu exhibit unstable behavior with temperature increase and are less heat resistant. The anode electrodes formed of Fe and Pd exhibited a change with temperature increase but the characteristics thereof were stabilized by annealing at 300 to 400° C. after deposition, and it is therefore considered that annealing after deposition can improve heat resistance up to the annealing temperature.

Example 2

Using trench MOS Schottky barrier diodes having the same structure as the trench MOS Schottky barrier diode 2 in the second embodiment, change in turn-on voltage when the material of the anode electrode serving as a Schottky electrode is different was examined.

In Example 2, the surface of the semiconductor layer was treated with buffered hydrofluoric acid before depositing the anode electrode.

Figure 6A:
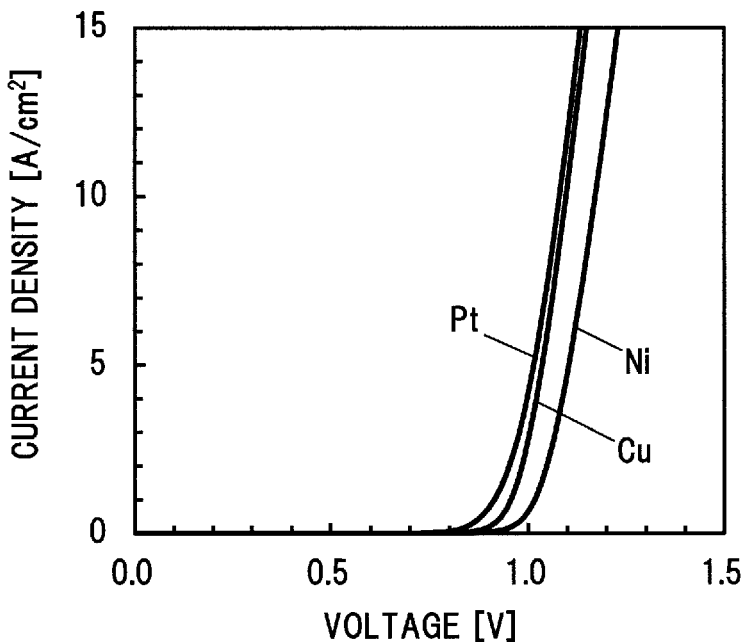
FIG. 6A is a graph showing a relation between a material of the anode electrode and a turn-on voltage of the trench MOS Schottky barrier diode in Example 2.

FIG. 6A is a graph showing a relation between a material of the anode electrode and a turn-on voltage of the trench MOS Schottky barrier diode in Example 2.

FIG. 6A shows that the turn-on voltages of the Schottky barrier diodes, when the anode electrode material is Cu, Ni and Pt, are all in the range of 0.9 to 1.1V.

The result shown in FIG. 6A is clearly different from the measurement result in Example 1, but it was found that the cause is that the buffered hydrofluoric acid was used in the pre-treatment before deposition of the anode electrode. This shows that the buffered hydrofluoric acid should not be used at the end of the pre-treatment before deposition of the anode electrode.

Next, a relation between the type of pre-treatment solution and the turn-on voltage was examined. Plural gallium oxide substrates were firstly prepared, were immersed respectively in hydrochloric acid, nitric acid, sulfuric acid, hydrofluoric acid, sulfuric acid/hydrogen peroxide mixture and buffered hydrofluoric acid for 5 minutes, and were then cleaned with running water. After that, a 200 µm-diameter, 200 nm-thick circular anode electrode formed of Cu and a cathode electrode composed of a 50 nm-thick Ti film and a 200 nm-thick Au film laminated on the Ti film were formed by vapor deposition.

Figure 6B:
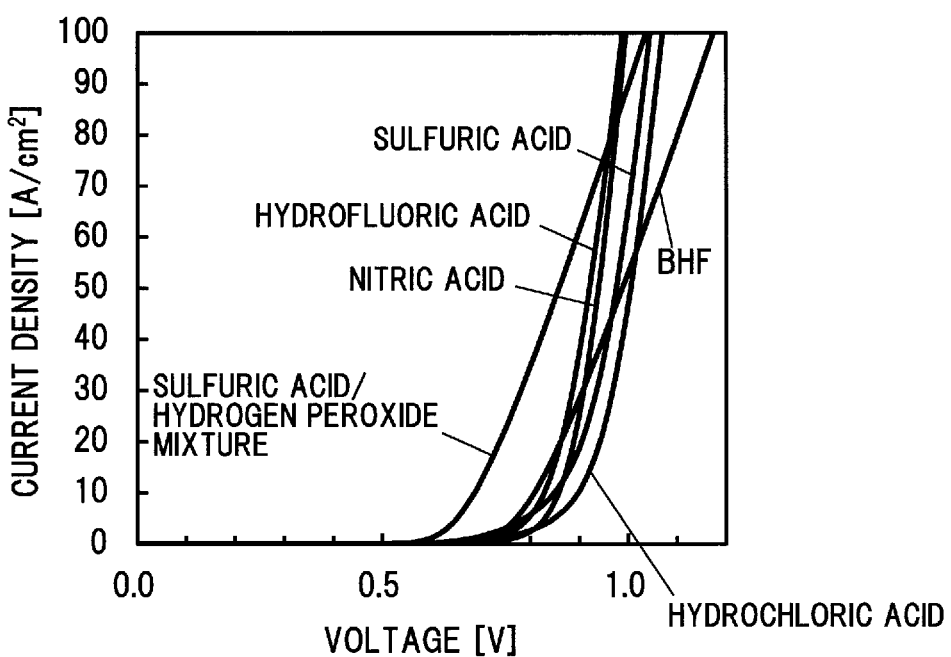
FIG. 6B is a graph showing a relation between a type of pre-treatment solution and a turn-on voltage in Example 2.

FIG. 6B is a graph showing a relation between the type of pre-treatment solution and the turn-on voltage in Example 2.

FIG. 6B shows that the turn-on voltage is as low as about 0.6 to 0.7V only when using the sulfuric acid/hydrogen peroxide mixture in the pre-treatment, and is fixed in the high turn-on voltage range when using hydrochloric acid, nitric acid, sulfuric acid, hydrofluoric acid or buffered hydrofluoric acid, i.e., when using a treatment solution other than the sulfuric acid/hydrogen peroxide mixture.

These results show that the turn-on voltage is prevented from being fixed in the high range by using the sulfuric acid/hydrogen peroxide mixture for the pre-treatment before formation of the anode electrode, or, when a solution other than sulfuric acid/hydrogen peroxide mixture is used, by treating with the sulfuric acid/hydrogen peroxide mixture after the treatment with such other solution.

Example 3

When forming a trench structure of the trench MOS Schottky barrier diode, a portion of the semiconductor layer formed of a $Ga_2O_3$-based single crystal, which should not be etched, needs to be protected by a masking material.

$SiO_2$, photoresist and Ni are often used as masking materials for dry etching. Of those, Ni is least likely to be etched and is the strongest as the masking material. However, since the $Ga_2O_3$-based single crystal is a material which is relatively difficult to etch, there is a problem that it is difficult to control selectivity even when Ni is used as the masking material.

Based on this, a relation between the dry etching conditions for $Ga_2O_3$ and the selectivity was investigated. Firstly, a mask formed of Ni was patterned on a $Ga_2O_3$ substrate using photolithography technique. The obtained sample was dry-etched under four conditions shown in Table 1 below, and the selectivity of Ni to $Ga_2O_3$ was evaluated.

TABLE 1

| | Gas | Pressure | Power (ICP/Bias) | Time |
|---|---|---|---|---|
| Condition 1 | $BCl_3$: 30 sccm | 0.5 Pa | 160 W/17 W | 5 minutes |
| Condition 2 | $BCl_3$: 30 sccm | 0.5 Pa | 300 W/50 W | 5 minutes |
| Condition 3 | $BCl_3$: 30 sccm | 0.5 Pa | 500 W/80 W | 5 minutes |
| Condition 4 | $BCl_3$: 30 sccm | 1.0 Pa | 800 W/250 W | 12.5 minutes |

As a result of the evaluation, the selectivity under the condition 4 was 1 (the etch rate of Ni is the same as that of $Ga_2O_3$) which shows that function of Ni as the mask is the lowest level, the selectivity under the condition 3 was 5.8 (the etch rate of Ni is 1/5.8 of that of $Ga_2O_3$), and the selectivity under the condition 2 was 14.7. Meanwhile, the selectivity under the condition 1 could not be quantified since Ni was hardly removed, but it was confirmed to be very high. Table 2 below summarizes the etch rate of $Ga_2O_3$ under the respective conditions.

TABLE 2

| | Etch rate |
|---|---|
| Condition 1 | 28.2 nm/min |
| Condition 2 | 82.8 nm/min |
| Condition 3 | 130 nm/min |
| Condition 4 | 194 nm/min |

There was a clear correlation between the etch rate and the power, and the etch rate tended to be lower with lower power. Under the condition 1 with which the selectivity to Ni was good, the etch rate was as low as 28.2 nm/min but was enough to be able to form trenches with a depth of several μm, which shows that the condition 1 is the best etching condition in terms of both the selectivity and the etch rate.

The inside of the trenches formed by dry etching was also observed, and it was found that needle-like roughness occurred on the bottom and side surfaces of the trenches. In trench MOS Schottky barrier diode in which the electric field applied around the bottoms of the trenches is highest, such unevenness in shape may cause concentration of electric field, leading to breakdown at lower voltage than the designed withstand voltage. Therefore, the portion around the bottoms of the trenches is preferably smooth so that the electric field is uniform.

Then, etching with phosphoric acid was experimentally performed to remove the needle-like product. A phosphoric acid was put in a glass beaker on a hot plate and was heated until the temperature reached 140° C., and then, a sample was immersed therein for 10 minutes. As a result, it was found that the needle-like roughness on the inner surfaces of the trenches on the $Ga_2O_3$ substrate can be completely removed by phosphoric acid treatment.

Example 4

The trench MOS Schottky barrier diode in the second embodiment was made.

Firstly, an Sn-doped $Ga_2O_3$ substrate having a thickness of 650 μm and a donor concentration of $2.5 \times 10^{18}$ cm$^{-3}$ was prepared as the second semiconductor layer 21. The Sn-doped $Ga_2O_3$ substrate was made by the EFG (Edge-defined, Film-fed Growth) method.

Next, an Si-doped $Ga_2O_3$ film having a thickness of 7.5 μm and a donor concentration of $6 \times 10^{16}$ cm$^{-3}$ was homoepitaxially grown as the first semiconductor layer 20 on the Sn-doped $Ga_2O_3$ substrate by the HVPE method.

Next, a 300 nm-thick $SiO_2$ film was formed on the entire surface of the Si-doped $Ga_2O_3$ film by sputter deposition, and a 200 nm-thick Ni film was formed thereon by electron beam evaporation. The Ni/$SiO_2$ laminated film was then patterned using photolithography technique.

Next, using the patterned Ni/$SiO_2$ laminated film as a mask, linear trenches parallel to a [010] direction of the Si-doped $Ga_2O_3$ film were formed as the trenches 22 on the surface of the Si-doped $Ga_2O_3$ film by an ICP-RIE system. The dry etching conditions were as follows: $BCl_3$ (30 sccm) as an etching gas, pressure of 0.5 Pa, antenna power of 160 W, and bias power of 17 W. The trenches had the depth $D_t$ of about 3.0 μm and the width $W_t$ of 4.8 μm, and the mesa-shaped portion had the width $W_m$ of 1.2 μm.

After dry etching and the subsequent treatment with phosphoric acid at 140° C. for 15 minutes, the sample was immersed in HF (46%) for 5 minutes to remove the $SiO_2$ film. Lastly, the sample was treated with the sulfuric acid/hydrogen peroxide mixture for 5 minutes to remove organic residues, etc., was cleaned with running water for 15 minutes, and was then dried by nitrogen blow.

Next, a 50 nm-thick $HfO_2$ film was formed as the insulating film 25 by ALD. At this time, an $O_3$ gas was used as an oxidizing agent.

Next, the surface of the Si-doped $Ga_2O_3$ film was polished to a depth of about 0.5 μm by CMP, and the $HfO_2$ film on the mesa-shaped portions between the trenches was thereby removed. This resulted in the Si-doped $Ga_2O_3$ film having a thickness of about 7.0 μm and the trench having the depth $D_t$ of about 2.5 μm.

Next, the back surface of the Sn-doped $Ga_2O_3$ substrate was mirror-polished by diamond lapping and CMP. This resulted in the Sn-doped $Ga_2O_s$ substrate having a thickness of 350 μm.

Next, the sample was immersed in acetone and was treated therewith for 10 minutes while applying an ultrasonic wave. Then, the sample was immersed in a sulfuric acid/hydrogen peroxide mixture for 5 minutes and then in a buffered hydrofluoric acid for 1 minute, and was cleaned with running water for 15 minutes. Residues left over from cleaning or wax used to fix the sample at the time of polishing can be roughly removed by the acetone, organic matters can be removed by the sulfuric acid/hydrogen peroxide mixture, and colloidal silica contained in CMP slurry can be removed by the buffered hydrofluoric acid. Lastly, the sample was again immersed in the sulfuric acid/hydrogen peroxide mixture for 5 minutes, was cleaned with running water and was dried by nitrogen blow.

Next, a 200 nm-thick Cu film, a 3.0 μm-thick Au film and a 50 nm-thick Ni film were laminated by electron beam evaporation, thereby forming a Cu/Au/Ni laminated film which serves as the trench MOS barriers 26 as well as the anode electrode 23. The deposition rate was 0.3 to 0.4 nm/s. The Cu film and the Au film were embedded in the trenches. The Ni film as the outermost layer was formed to increase adhesion with photoresist used in the next step.

The Cu film may be penetrated by Au when too thin and may be separated from Au due to the difference in thermal expansion when too thick. For this reason, experiment was conducted under several different conditions. As a result, it was found that the preferable thickness of the Cu film is about 10 to 400 nm. Based on this finding, the Cu film in Example 4 was formed to have a thickness of 200 nm which is an intermediate value between 10 and 400 nm.

Next, a photoresist was patterned on the Cu/Au/Ni laminated film which was then wet-etched using the photoresist as a mask. The sample was firstly treated with a mixture of nitric acid, hydrochloric acid and water (with a volume ratio of nitric acid:hydrochloric acid:water=2:2:1) for 6 seconds to remove the Ni film, and was then immersed in AURUM-302 (manufactured by Kanto Chemical), which is an Au etchant, for about 2 hours. After that, ultrasonic cleaning in acetone was performed for 5 minutes to remove the photoresist. An anode electrode portion of the Cu/Au/Ni laminated film was thereby patterned into a circular shape with a diameter of 400 μm.

Lastly, a 50 nm-thick Ti film and a 200 nm-thick Au film were formed on the entire back surface of the Sn-doped $Ga_2O_3$ substrate by electron beam evaporation, and a Ti/Au laminated film as the cathode electrode 24 was thereby formed. For the purpose of comparison, a sample without trenches (normal Schottky barrier diode) was also made on the same epi-wafer.

Figure 7A:
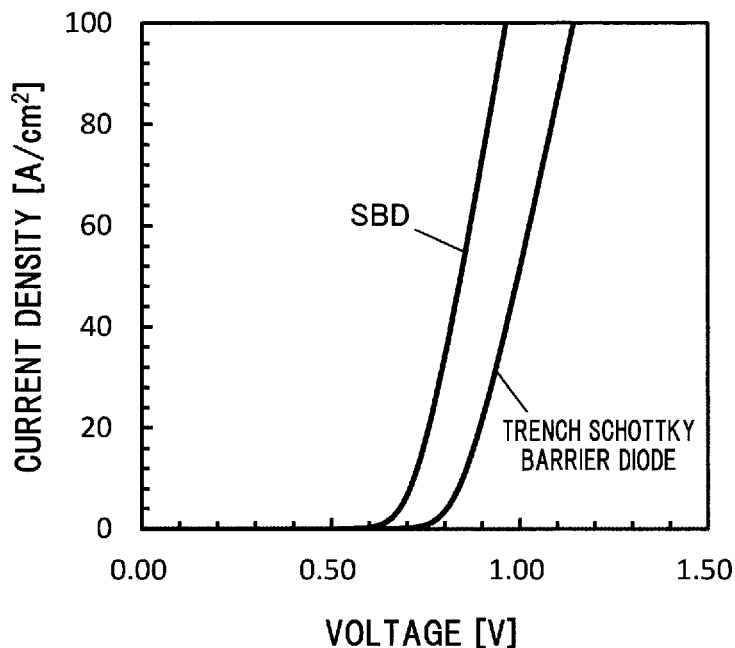
FIG. 7A shows forward characteristics of a trench MOS Schottky barrier diode in Example 4 and of a normal Schottky barrier diode in Comparative Example.

FIG. 7A shows forward characteristics of the trench MOS Schottky barrier diode 2 in Example 4 and of the normal Schottky barrier diode in Comparative Example. In the drawing, "trench SBD" denotes the trench MOS Schottky barrier diode 2 and "SBD" denotes the normal Schottky barrier diode as Comparative Example in which trenches are not formed.

FIG. 7A shows that the trench MOS Schottky barrier diode 2 has a higher on-resistance than the normal Schottky barrier diode. This is due to the fact that the electric current path is narrowed by providing the trench MOS structure, hence, it is a reasonable result.

Figure 7B:
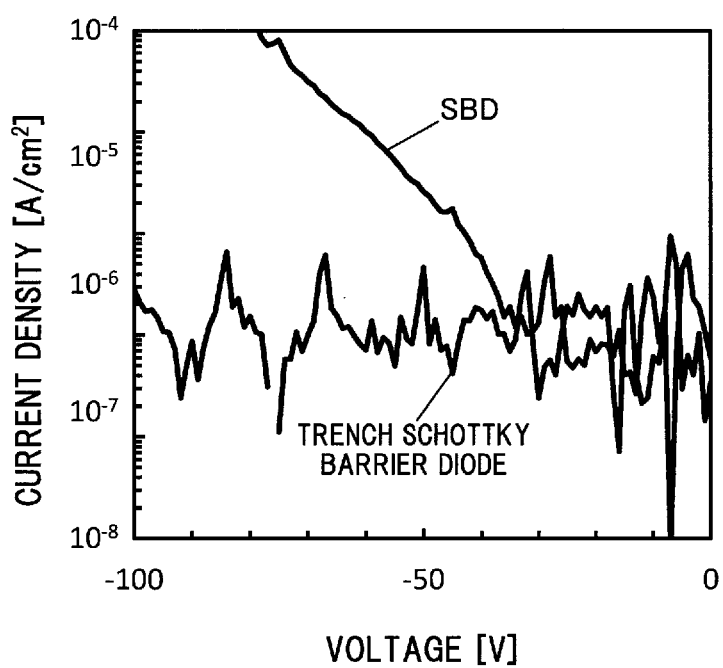
FIG. 7B shows reverse characteristics of the trench MOS Schottky barrier diode in Example 4 and of the normal Schottky barrier diode in Comparative Example.

FIG. 7B shows reverse characteristics of the trench MOS Schottky barrier diode 2 in Example 4 and of the normal Schottky barrier diode in Comparative Example. While the normal Schottky barrier diode without trenches exhibits leakage characteristics substantially the same as predicted by the thermionic field emission theory, leakage current in the trench MOS Schottky barrier diode 2 is several orders of magnitude less than the normal Schottky barrier diode. This is because electric field strength at the Schottky junction portion was decreased by providing the trench MOS structure and leakage current due to thermionic field emission (TFE) was reduced.

Next, another trench MOS Schottky barrier diode was newly made by the same process, except that the last step of immersion in the sulfuric acid/hydrogen peroxide mixture and cleaning with running water was omitted in the pretreatment before deposition of the Cu/Au/Ni laminated film formed as the trench MOS barriers 26 and the anode electrode 23. The width $W_t$ of trenches was 5 μm and the width $W_m$ of the mesa-shaped portions was 1 μm. The Si-doped $Ga_2O_3$ film was formed to have a donor concentration of $5 \times 10^{16}$ cm$^{-3}$ and a final thickness of 8.0 μm. For the purpose of comparison, a sample without trenches (normal Schottky barrier diode) subjected to the same pretreatment was also made on the same epi-wafer.

Figure 8A:
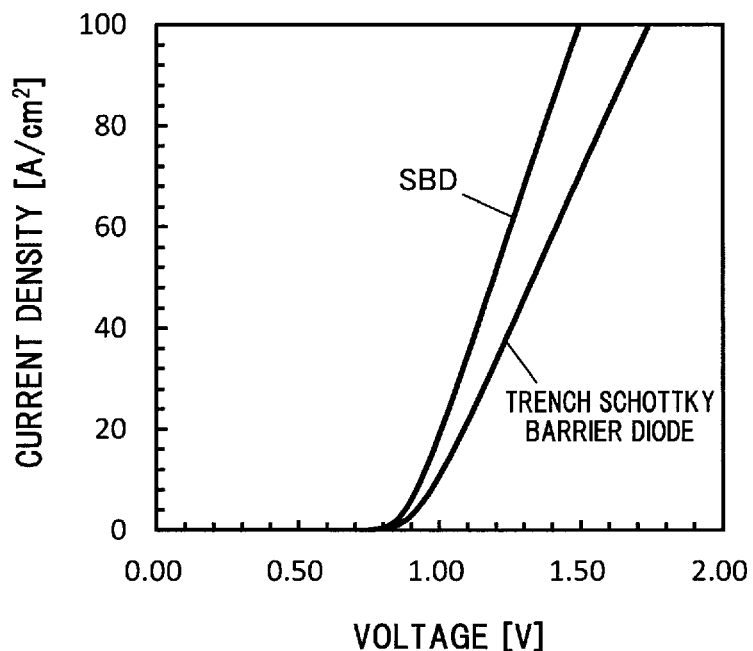
FIG. 8A shows forward characteristics of a trench MOS Schottky barrier diode as Comparative Example and of the normal Schottky barrier diode.
Figure 8B:
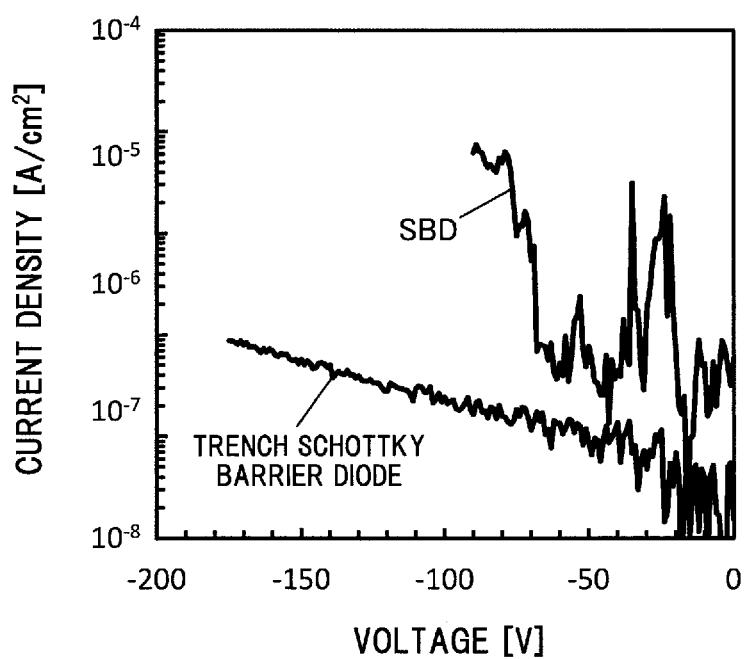
FIG. 8B shows reverse characteristics of the trench MOS Schottky barrier diode as Comparative Example and of the normal Schottky barrier diode.

FIGS. 8A and 8B show forward characteristics and reverse characteristics of the newly made trench MOS Schottky barrier diode as Comparative Example and of the normal Schottky barrier diode. The turn-on voltage of the trench MOS Schottky barrier diode is larger in FIG. 8A than in FIG. 7A. It is considered that this is because the treatment with the sulfuric acid/hydrogen peroxide mixture after the treatment with the buffered hydrofluoric acid was omitted in the pre-treatment before deposition of the Cu/Au/Ni laminated film.

In FIG. 8B, the leakage current in the trench MOS Schottky barrier diode is several orders of magnitude less than the leakage current in the normal Schottky barrier diode in the similar manner to that in FIG. 7B but, from the viewpoint of withstand voltage, the electrode was broken at about 175V in the trench MOS Schottky barrier diode and at about 90V in the normal Schottky barrier diode. When the broken electrodes were observed, it was found that breakdown occurred at the end portion of the electrode in both the normal Schottky barrier diode and the trench MOS Schottky barrier diode.

Next, to prevent breakdown from occurring at the end portion of the electrode and to improve withstand voltage, a trench MOS Schottky barrier diode having a field-plate structure was made. For the purpose of comparison, a sample having a field-plate structure and not having trenches (normal Schottky barrier diode) was also made on the same epi-wafer.

Figure 9:
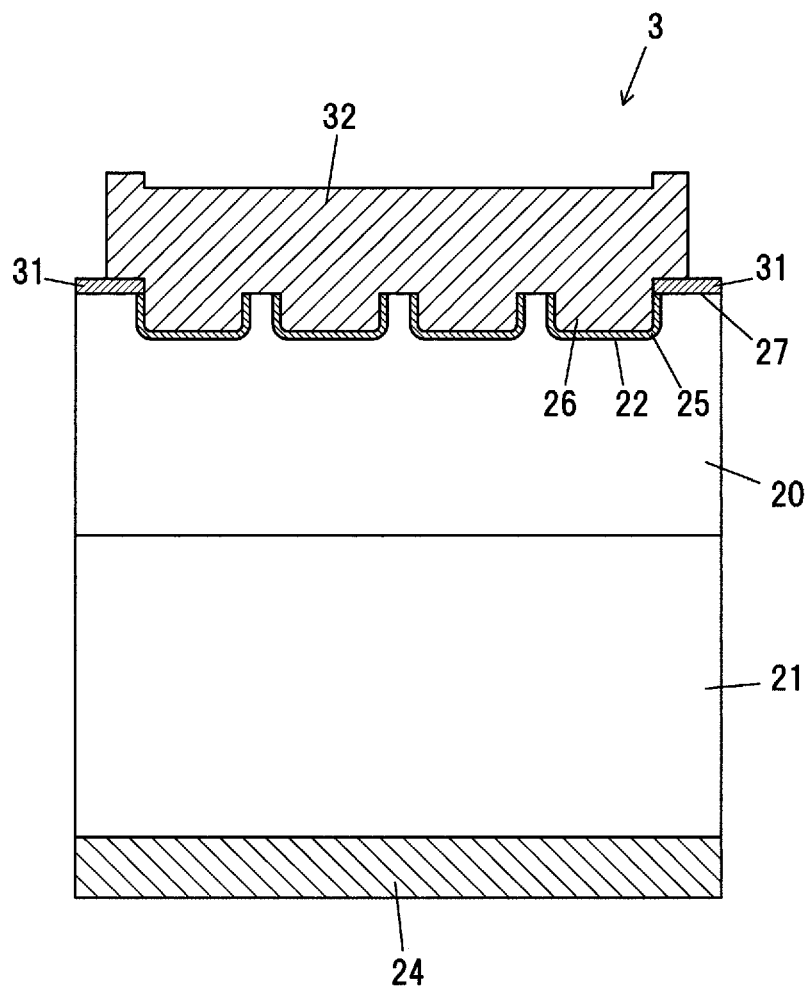
FIG. 9 is a vertical cross-sectional view showing a trench MOS Schottky barrier diode having a field-plate structure in Example 4.

FIG. 9 is a vertical cross-sectional view showing a trench MOS Schottky barrier diode 3 having a field-plate structure in Example 4. In the trench MOS Schottky barrier diode 3, a dielectric layer 31 formed of $SiO_2$ is provided on the surface 27 of the first semiconductor layer 20 so as to be located around an anode electrode 32, and the edge of an anode electrode 32 rides over the dielectric layer 31.

Figure 10A:
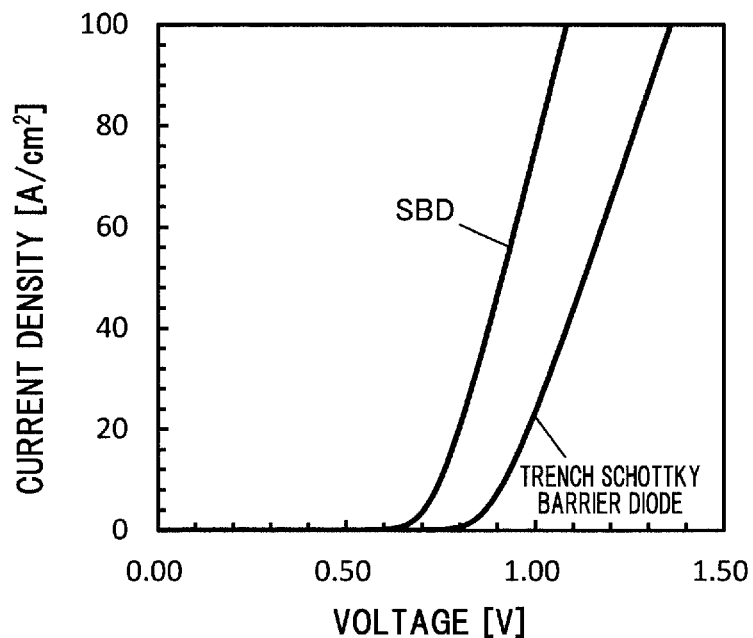
FIG. 10A shows forward characteristics of the trench MOS Schottky barrier diode in Example 4 and of the normal Schottky barrier diode in Comparative Example.
Figure 10B:
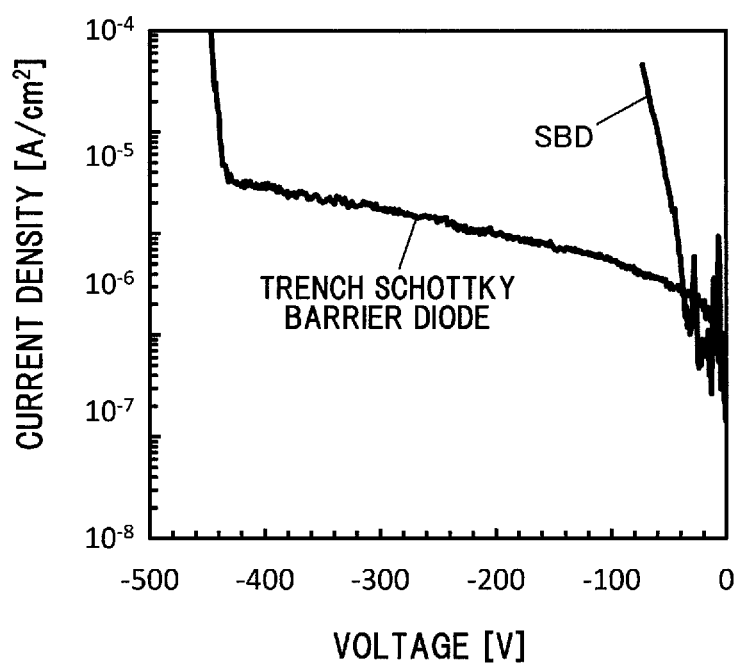
FIG. 10B shows reverse characteristics of the trench MOS Schottky barrier diode in Example 4 and of the normal Schottky barrier diode in Comparative Example.

FIGS. 10A and 10B show forward characteristics and reverse characteristics of the trench MOS Schottky barrier diode 3 in Example 4 and of the normal Schottky barrier diode in Comparative Example.

FIG. 10B shows that withstand voltage of the trench MOS Schottky barrier diode is increased to about 450V by providing the field-plate structure.

Example 5

Using the trench MOS Schottky barrier diode 2 in Example 4 pertaining to FIG. 7, a comparison was conducted between when the trenches 22 were linear trenches parallel to the [010] direction of the Si-doped $Ga_2O_3$ film serving as the first semiconductor layer 20 and were linear trenches parallel to a [100] direction.

After forming the trenches by dry etching so that the width $W_m$ of the mesa-shaped portions between the trenches was 2.5 μm, treatment was performed with phosphoric acid, resulting in the mesa-shaped portions between the trenches parallel to the [010] direction having the width $W_m$ of 1 to 1.5 μm and the mesa-shaped portions between the trenches parallel to the [100] direction having the width $W_m$ of about 2 μm. It is considered that this is because the etch rate in phosphoric acid is different depending on the orientation of $Ga_2O_3$.

After that, forward characteristics of the completed trench MOS Schottky barrier diode 2 were evaluated. The results was that on-resistance of the diode having the linear trenches parallel to the [100] direction, in which the width $W_m$ of the mesa-shaped portions is wide and the current path thus should be wide, was about 1.5 times to twice higher than on-resistance of the diode having liner trenches parallel to the [010] direction.

The reason is considered to be as follows: since the mesa-shaped portions between the linear trenches parallel to the [100] direction are hardly etched by the phosphoric acid as described above, damage due to dry etching remains and the effective current path is narrowed due to electric charge of the layer with the unremoved damage.

This result shows that the orientation of the linear trenches is preferably parallel to the [010] direction of the $Ga_2O_3$-based single crystal constituting the first semiconductor layer 20. In addition, it was also shown that a thickness of the damage layer on the inner surfaces of the trenches 22 (on the surfaces of the mesa-shaped portions) produced by dry etching performed to form the trenches 22 is around 0.5 μm and it is preferable to remove the damage layer by treating with phosphoric acid.

Although the embodiments and Examples of the invention have been described, the invention is not intended to be limited to the embodiments and Examples, and the various kinds of modifications can be implemented without departing from the gist of the invention.

In addition, the invention according to claims is not to be limited to the embodiments and Examples described above. Further, it should be noted that all combinations of the features described in the embodiments and Examples are not necessary to solve the problem of the invention.

INDUSTRIAL APPLICABILITY

A Schottky barrier diode is provided which is formed using a $Ga_2O_3$-based semiconductor and has a lower turn-on voltage than the known Schottky barrier diodes.

REFERENCE SIGNS LIST

1 SCHOTTKY BARRIER DIODE
2, 3 TRENCH MOS SCHOTTKY BARRIER DIODE
10 SEMICONDUCTOR LAYER
11, 23 ANODE ELECTRODE
12, 24 CATHODE ELECTRODE
20 FIRST SEMICONDUCTOR LAYER
21 SECOND SEMICONDUCTOR LAYER
22 TRENCH
25 INSULATING FILM
26 TRENCH MOS BARRIER

The invention claimed is:

1. A Schottky barrier diode, comprising:
a first semiconductor layer comprising a $Ga_2O_3$-based single crystal:
an anode electrode which forms a Schottky junction with the first semiconductor layer and whose portion to contact with the first semiconductor layer comprises Fe or Cu:
a cathode electrode; and
a second semiconductor layer that comprises a $Ga_2O_3$-based single crystal and is laminated on the first semiconductor layer,
wherein the first semiconductor layer comprises trenches opening on a surface opposite to the second semiconductor layer, inner surfaces of the trenches are covered with insulating films, and trench MOS barriers are embedded in the trenches so as to be covered with the insulating films,
wherein the anode electrode is to contact with the trench MOS barriers, and the cathode electrode is connected to the second semiconductor layer.

2. The Schottky barrier diode according to claim 1, wherein the portion of the anode electrode to contact with the first semiconductor layer comprises Fe, and a turn-on voltage is not less than 0.4 V and not more than 0.7 V.

3. The Schottky barrier diode according to claim 1, wherein the portion of the anode electrode to contact with the first semiconductor layer comprises Cu, and a turn-on voltage is not less than 0.6 V and not more than 0.9 V.

* * * * *